United States Patent [19]

Srodes et al.

[11] Patent Number: 4,915,779

[45] Date of Patent: Apr. 10, 1990

[54] RESIDUE-FREE PLASMA ETCH OF HIGH TEMPERATURE ALCU

[75] Inventors: G. Scot Srodes, Mesa; Willis R. Goodner, Chandler; John L. Freeman, Jr., Mesa; Andrew G. Nagy, Phoenix, all of Ariz.

[73] Assignee: Motorola Inc., Schaumburg, Ill.

[21] Appl. No.: 235,134

[22] Filed: Aug. 23, 1988

[51] Int. Cl.$^4$ ............... H01L 21/306; C23F 1/00
[52] U.S. Cl. ................... 156/643; 156/656; 156/659.1; 156/665; 156/666
[58] Field of Search ............ 156/643, 656, 659.1, 156/665, 666

[56] References Cited

U.S. PATENT DOCUMENTS

| | | | |
|---|---|---|---|
| 4,030,967 | 6/1977 | Ingrey | 156/665 |
| 4,062,720 | 12/1977 | Alcorn et al. | 156/665 |
| 4,182,646 | 1/1980 | Zajac | 156/665 |
| 4,333,814 | 6/1982 | Küyel | 156/643 |
| 4,637,129 | 1/1987 | Dekits et al. | 156/643 |
| 4,717,445 | 1/1988 | Leung | 156/643 |
| 4,790,903 | 12/1988 | Sugano et al. | 156/643 |

*Primary Examiner*—David L. Lacey
*Assistant Examiner*—Todd J. Burns
*Attorney, Agent, or Firm*—Joe E. Barbee

[57] ABSTRACT

A residue-free plasma etch of high temperature aluminum copper metallization is provided by the use of a single plasma etcher. The metallization layer is covered by a protective oxide layer. This structure is then placed in the single etcher and a vacuum is established. The protective oxide layer is then etched and without breaking the vacuum or removing the structure from the etcher the metal layer is also etched. This results in the etched surface being residue-free.

10 Claims, 1 Drawing Sheet

RESIDUE-FREE PLASMA ETCH OF HIGH TEMPERATURE ALCU

BACKGROUND OF THE INVENTION

This invention relates, in general, to the patterning of metal on a semiconductor structure, and more particularly, to a method for providing a residue free plasma etch of a high temperature aluminum copper layer.

As integrated circuits become smaller and smaller in size in order to achieve a higher density semiconductor device, it becomes more important for the metal lines to become narrower and have better surface morphology. In order to achieve the better surface morphology and eliminate hillocks the metallization must be deposited at high temperatures. Typically speaking, high temperatures refer to those temperatures over 350° C.

A typical metallization alloy is aluminum having approximately 1 to 4% copper. One of the disadvantages in using a high temperature deposited aluminum copper alloy is the etch residues left after patterning the metallization layer in a plasma process. This results, not only because of the non-volatility of the copper chlorides formed, but also due to the micro-masking caused by localized oxidation, primarily along the grain boundaries of the high temperature AlCu. Therefore, is would be desirable to provide a residue-free plasma etch process of high temperature aluminum copper.

Accordingly, it is an object of the present invention to provide a means to etch high temperature aluminum copper without leaving post-etch residues.

Another object of the present invention is to provide a method for residue-free etching of high temperature aluminum copper films.

Yet a further object of the present invention is to provide a procedure for etching a protective oxide coating and a high temperature aluminum copper layer in the same etcher.

SUMMARY OF THE INVENTION

The above and other objects and advantages of the present invention are achieved by providing a procedure for etching an oxide and a high temperature aluminum copper (AlCu) layer in the same etcher. After the aluminum copper layer has been deposited a protective cap is placed over the aluminum copper layer. Photoresist is then provided and patterned over the protective cap. A semiconductor structure containing the AlCu layer, protective cap layer, and the patterned photoresist is then placed in an etcher. A vacuum is then drawn to leave the semiconductor structure in a vacuum. The protective cap is then etched through the patterned photoresist layer to remove portions of the protective cap not covered by the patterned photoresist. After the protective cap has been etched, the exposed portions of the AlCu layer are etched off also. Once the semiconductor structure is placed in the etcher and a vacuum is drawn the vacuum is maintained until after the aluminum copper metallization layer has been etched.

In a preferred embodiment the aluminum copper alloy is deposited at a temperature over 350° C. and the etcher used is a reactive ion etcher. The protective cap can be any suitable material to protect the underlying metallization from the processing environment. Examples are plasma enhanced oxide or nitrides, other metallic layers, organic films, other oxides or the like.

DETAILED DESCRIPTION OF THE INVENTION

Figure 1:
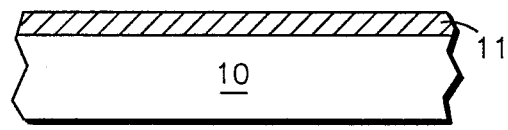
FIGS. 1-4 illustrate a portion of a semiconductor structure being prepared in accordance with an aspect of the present invention.

FIG. 1 illustrates a portion of a semiconductor structure 10 covered by metallization layer 11. Semiconductor structure 10 can consist of selectively doped areas to form transistors such as bipolar transistors, MOS transistors, other semiconductor devices, or a combination of such devices. In addition, semiconductor structure 10 may have metallization layers separated by dielectrics underneath metallization layer 11. In other words, metallization layer 11 may form a first layer of metal or a subsequent layer of metal in a multi-layer metallization system. Metallization layer 11 can be an alloy of aluminum with one to four percent copper; however, in a preferred embodiment, metallization layer 11 has approximately 1.5% copper. The aluminum copper (AlCu) alloy is formed at a temperature over 350° C. but preferably below 500° C. This high temperature aluminum copper is preferred because it has better morphology and is free of hillocks.

Figure 2:
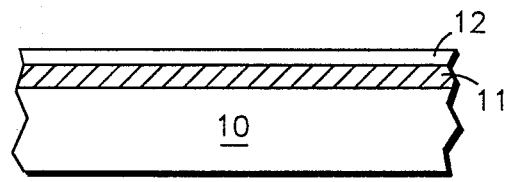

FIG. 2 illustrates the structure of FIG. 1 having a protective cap 12 over metallization layer 11. Protective cap 12 can be any suitable material such as a low temperature oxide (formed below 500° C.). In a preferred embodiment protective cap 12 is a plasma enhanced oxide, and is approximately 200 to 300 nanometers thick.

Figure 3:
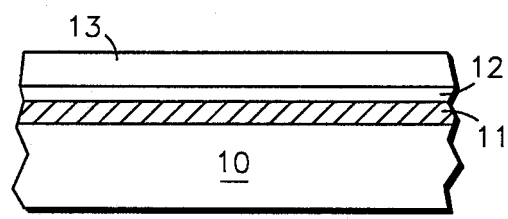

FIG. 3 illustrates the structure of FIG. 2 covered by photoresist layer 13. Photoresist layer 13 is typically 1.2 to 2.5 microns thick.

Figure 4:
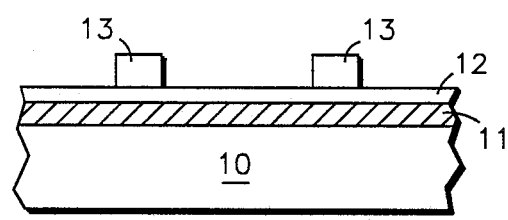

FIG. 4 illustrates the structure of FIG. 3 with photoresist 13 being patterned to leave portions of protective layer 12 covered by photoresist 13. Protective cap 12 serves as a hard mask to protect the surface of aluminum copper metallization layer 11 during application of photoresist layer 13 and during the pattern development to prevent the formation of localized micro masking.

The structure of FIG. 4 is placed in an etcher. The etcher is preferably an AME8130 or an AME8330 reactive ion etcher, well known to those skilled in the art. Once the structure is placed in the etcher a vacuum is drawn and the portions of hard mask 12 not covered by patterned photoresist 13 are etched away to provide the structure illustrated in FIG. 5. By way of example, the etching can be accomplished by using a flow of $CHF_3$ in a 50 millitorr vacuum with a DC bias of approximately $-440$ volts for approximately 13 minutes.

Figure 5:
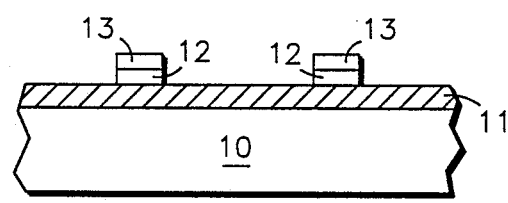
FIGS. 5 and 6 illustrate a portion of the semiconductor structure after it has been placed in an etcher in accordance with the procedures of the present invention.
Figure 6:
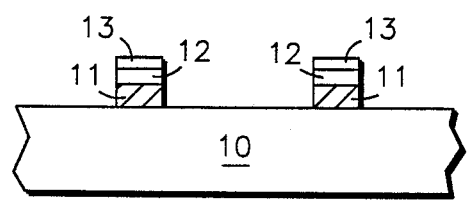

FIG. 6 illustrates the structure of FIG. 5 after metallization layer 11 has been etched in the same etcher that oxide mask 12 was etched in without breaking the vacuum of the etcher. By way of example, metal layer 11 was etched with a flow of $CF_4$, $O_2$, $BCL_3$, and $CL_2$. It will be understood that during the etching of oxide mask 12 and layer 11 that photoresist 13 is slightly etched also. However, due to the thickness and characteristics of photoresist 13, in combination with hard mask 12 the etchant will etch through metal layer 11 before completely etching away hard mask 12 and photoresist 13. There are several suitable photoresists that can be used, one such is AZ 5214 photoresist.

The utilization of one common reactive ion etcher for etching both the protective layer and the metal layer prevents a formation of micro masks both during the protective layer etch and between the protective layer etch and the completion of the metal etch. The DC bias used along with the flow rates, vacuum, and etch times are all well known to those skilled in the art. It is customary to do a cleaning operation known as a "descum" step which consists of flowing oxygen through the etcher for approximately one minute before and after the etch of the protective layer.

In the past, bilevel structures consisting of a hardmask and the high temperarture aluminum copper metal were etched in two different etchers. A first etcher, such as an AME8110 was used to etch the protective oxide layer positioned over the metal layer. The devices were then removed from the first etcher and transferred to a second etcher, such as an AME8130, where the high temperature aluminum copper metal layer was etched. This old procedure resulted in metal residues, the use of two different etchers, and additional handling of the wafers being transferred between etchers.

By now it should be appreciated that there has been provided a method for a residue-free plasma etch of high temperature aluminum copper which uses only one etcher. This results in a savings of time and equipment in addition to providing more reliable semiconductor devices since the etch surface is now residue-free. The etching all takes place in one etcher without breaking the vacuum established once the semiconductor structure to be etched is inserted into the etcher.

We claim:

1. A residue-free, plasma etch of high temperature AlCu layer, comprising: providing the high temperature AlCu layer on a semiconductor support; providing a protective layer over the AlCu layer; providing a layer of photoresist over the protective layer; patterning the photoresist to leave exposed portions of the protective layer; placing all the layers in a vacuum in a reactive ion etcher; etching through the exposed protective layer to expose portions of the AlCu layer; and etching through the exposed portions of the AlCu layer, wherein the vacuum is held continuously between the protective layer etching and AlCu layer etching steps to provide the residue-free high temperature AlCu.

2. The residue-free, plasma etch of claim 1 wherein the high temperature AlCu layer is a layer deposited at a temperature in the range of 350° C. to 500° C.

3. The residue-free, plasma etch of claim 1 wherein the vacuum is maintained by not opening the etcher between the etching of the exposed protective layer and the etching through the exposed AlCu layer.

4. The residue-free, plasma etch of claim 1 wherein the protective layer is a plasma enhanced oxide.

5. A method for providing a residue-free high temperature AlCu metallization layer etching after the AlCu metallization layer has been deposited on a semiconductor structure, comprising: providing the high temperature AlCu layer on a semiconductor support; providing a protective layer over the AlCu metallization layer; providing a photoresist layer over the protective layer and patterning the photoresist layer to leave exposed portions of the protective layer; placing the semiconductor structure in a vacuum in a reactive ion etcher; etching away the exposed portions of the protective layer to leave exposed portions of the AlCu metallization layer; and etching away the exposed portions of the AlCu metallization layer to leave a residue-free area, wherein the protective layer and AlCu metallization layer are etched without breaking the vacuum in which the semiconductor structure was placed before the step of etching the protective layer.

6. The method of claim 5 wherein the protective layer is a plasma enhanced oxide layer formed at a temperature below 500° C.

7. The method of claim 6 wherein the oxide layer is a plasma enhanced oxide and serves as a hardmask.

8. The method of claim 6 wherein the oxide layer is approximately 200 to 300 nanometers thick and the photoresist layer is approximately 1.2 to 2.5 microns thick.

9. A method for etching a high temperature metallization layer on a semiconductor structure in a manner to provide a residue-free surface, comprising: providing the semiconductor structure; providing the high temperature metallization layer on the semiconductor structure; providing a protective layer over the metallization layer; providing a layer of photoresist over the protective layer and patterning the photoresist to expose portions of the protective layer; placing the semiconductor structure in a plasma etcher and creating a vacuum around the semiconductor structure; etching away the exposed portions of the protective layer to expose portions of the metallization layer while maintaining the vacuum; and etching away the exposed portions of the metallization layer without breaking the vacuum around the semiconductor structure to provide a residue-free surface where the exposed portions of the metallization layer had previously existed.

10. The method of claim 9 wherein the high temperature metallization layer is deposited at a temperature over 350° C., the protective layer is a layer of oxide, and the etcher is a reactive ion etcher.

* * * * *